United States Patent
Choi (10) Patent No.: US 11,620,881 B2
(45) Date of Patent: Apr. 4, 2023

(54) HAPTIC FEEDBACK FIBER BODY, HAPTIC FEEDBACK FABRIC AND WEARABLE DEVICE

(71) Applicant: CHUNGANG UNIVERSITY INDUSTRY-ACADEMIC COOPERATION FOUNDATION, Seoul (KR)

(72) Inventor: Seung Tae Choi, Seoul (KR)

(73) Assignee: CHUNGANG UNIVERSITY INDUSTRY-ACADEMIC COOPERATION FOUNDATION, Seoul (KR)

( * ) Notice: Subject to any disclaimer, the term of this patent is extended or adjusted under 35 U.S.C. 154(b) by 910 days.

(21) Appl. No.: 16/484,275

(22) PCT Filed: Jan. 26, 2018

(86) PCT No.: PCT/KR2018/001178
§ 371 (c)(1),
(2) Date: Aug. 7, 2019

(87) PCT Pub. No.: WO2018/147583
PCT Pub. Date: Aug. 16, 2018

(65) Prior Publication Data
US 2019/0392688 A1    Dec. 26, 2019

(30) Foreign Application Priority Data
Feb. 8, 2017    (KR) .................... 10-2017-0017702

(51) Int. Cl.
*H01L 41/193*    (2006.01)
*G08B 6/00*    (2006.01)
(Continued)

(52) U.S. Cl.
CPC .............. *G08B 6/00* (2013.01); *B06B 1/0688* (2013.01); *D01F 6/12* (2013.01); *D03D 15/00* (2013.01);
(Continued)

(58) Field of Classification Search
CPC ........... G08B 6/00; D01F 6/12; B06B 1/0688; H01L 41/193; H01L 41/082; D10B 2401/18
See application file for complete search history.

(56) References Cited

U.S. PATENT DOCUMENTS 10,762,751 B2 *    9/2020    Kessler ................... G06F 1/163
10,982,358 B2 *    4/2021    Alexander ............... D04B 1/18
(Continued)

FOREIGN PATENT DOCUMENTS

KR    10-1282848 B1    7/2013
KR    10-2014-0009750 A    1/2014
(Continued)

OTHER PUBLICATIONS

Choi, Seung Tae, Journal of KSNVE, The Korean Society for Noise and Vibration Engineering, vol. 25, No. 2, Apr. 2015, pp. 8-11.

*Primary Examiner* — J. San Martin
(74) *Attorney, Agent, or Firm* — Novick, Kim & Lee PLLC; Jae Youn Kim (57) ABSTRACT

Provided are a haptic feedback fiber body, a haptic feedback fabric, and a wearable device. The haptic feedback fiber body can include a core fiber having a first electrode to surround the outer surface thereof, and a vibrating fiber, provided so as to intermittently contact the outer surface of the core fiber, including a second electrode on the inner surface thereof, wherein a piezoelectric polymer is provided on the outer surface of the first electrode or on the inner surface of the second electrode to generate fretting vibrations when the polymer is in close contact with the first
(Continued)

electrode or the second electrode on which the piezoelectric polymer is disposed opposite to each other.

19 Claims, 8 Drawing Sheets

(51) Int. Cl.
   *B06B 1/06* (2006.01)
   *D01F 6/12* (2006.01)
   *H01L 41/08* (2006.01)
   *D03D 15/00* (2021.01)

(52) U.S. Cl.
   CPC .......... *H01L 41/082* (2013.01); *H01L 41/193* (2013.01); *D10B 2401/06* (2013.01); *D10B 2401/16* (2013.01); *D10B 2401/18* (2013.01)

(56) References Cited

U.S. PATENT DOCUMENTS

| | | | |
|---|---|---|---|
| 2017/0029985 A1* | 2/2017 | Tajitsu | H01L 41/113 |
| 2018/0108826 A1* | 4/2018 | Tajitsu | H01L 41/047 |
| 2018/0171514 A1* | 6/2018 | Cobanoglu | D03D 15/25 |
| 2019/0003905 A1* | 1/2019 | Yoshida | H01L 41/087 |
| 2019/0008687 A1* | 1/2019 | Ishiura | A61F 13/00063 |
| 2019/0017885 A1* | 1/2019 | Horter | G01L 1/146 |
| 2019/0112734 A1* | 4/2019 | Podhajny | A41D 31/02 |
| 2019/0267538 A1* | 8/2019 | Yoshida | H01L 41/082 |
| 2019/0273199 A1* | 9/2019 | Tajitsu | D03D 15/41 |
| 2020/0007053 A1* | 1/2020 | Hays | A45C 15/00 |
| 2021/0135087 A1* | 5/2021 | Tajitsu | D04C 1/06 |

FOREIGN PATENT DOCUMENTS

| | | |
|---|---|---|
| KR | 10-2016-0091704 A | 8/2016 |
| KR | 10-1703739 B1 | 2/2017 |

* cited by examiner

HAPTIC FEEDBACK FIBER BODY, HAPTIC FEEDBACK FABRIC AND WEARABLE DEVICE

TECHNICAL FIELD

The present invention relates to a haptic feedback fiber body and a haptic feedback fabric, and more particularly, to a haptic feedback fiber body and a haptic feedback fabric which are used for manufacturing a wearable device.

BACKGROUND ART

Wearable devices, such as smart wear, are futuristic garments having a new concept with which new technology is combined and which break the concept of traditional clothing. Smart wear includes futuristic garments which break away from traditional textiles and garment concepts by being combined with new technology such as information technology (IT), biotechnology (BT), nano scale manufacturing technology, and eco-friendly material (ET).

Smart wear is required for extreme miniaturization and extreme weight reduction in semiconductor chips, sensors, and digital devices. A new concept has been introduced of combining functionality of fiber materials for detecting external stimuli and for self-responding with mechanical functions which clothing and textiles themselves do not have.

Meanwhile, haptic feedback which employs a tactile feedback method is a method of outputting a physical force to a user on the basis of an event or interaction occurring in various graphic environments. When a touch is detected on a touch screen, the haptic feedback method applies a vibration to transfer a haptic sensation to the user.

Since the haptic feedback method is mainly used only for a touch screen of a portable electronic device, it is necessary to develop a technique which is capable of providing haptic feedback to a user even in wearable devices such as the above-described smart wear.

DISCLOSURE

Technical Problem

The present invention is directed to providing a haptic feedback fiber body, a haptic feedback fabric, and a wearable device, which are capable of implementing a haptic feedback function by applying a fabric body, in which a piezoelectric polymer material is used, to a textile and a wearable device.

Technical Solution

One aspect of the present invention provides a haptic feedback fiber body including a core fiber having a first electrode which surrounds an outer surface thereof, a vibrating fiber provided to be brought into intermittent contact with the outer surface of the core fiber and having an inner surface on which a second electrode is provided, wherein a piezoelectric polymer is provided on an outer surface of the first electrode or an inner surface of the second electrode, and, when the piezoelectric polymer is pressed against either the first electrode or the second electrode opposite the first electrode, a fretting vibration is generated.

The haptic feedback fiber body may further include a spacer fiber wound on the outer surface of the core fiber to form a gap between the core fiber and the vibrating fiber.

The spacer fiber may be provided to surround the outer surface of the core fiber in a helical shape.

One or more vibrating fibers may be provided on the outer surface of the core fiber, on which the spacer fiber is wound, in a length direction of the core fiber.

The haptic feedback fiber body may further include a fixing fiber wound around the core fiber to fix the vibrating fibers fixed to the outer surface of the core fiber.

The fixing fiber may be provided to surround the outer surface of the core fiber in a helical shape to pass through the helical shape in which the spacer fiber is wound.

Each of the spacer fiber and the fixing fiber may be made of a non-conductive material.

The vibrating fiber and the spacer fiber may be provided to surround the outer surface of the core fiber in a spiral shape, the vibrating fiber may intersect the spacer fiber in a diagonal direction, and the spacer fiber may be provided to be disposed between the vibrating fiber and the outer surface of the core fiber.

The piezoelectric polymer may include a polyvinylidene fluoride (PVDF)-based ferroelectric polymer or a relaxor ferroelectric polymer.

The PVDF-based ferroelectric polymer may include P(vinylidene fluoride (VDF)-trifluoroethylene (TrFE)), and the relaxor ferroelectric polymer may include P(VDF-trifluoroethylenechlorofluoroethylene (TrFECFE)) or P(VDF-TrFE-chlorotrifluoroethylene (CTFE).

Another aspect of the present invention provides a haptic feedback fabric including a first vibrating fiber having one surface on which a first electrode is provided, a second vibrating fiber having one surface on which a second electrode opposite the first electrode is provided, and a spacer fiber formed to intersect between the first vibrating fiber and the second vibrating fiber so as to form a gap between the first vibrating fiber and the second vibrating fiber, wherein a piezoelectric polymer is provided on an outer surface of the first electrode or an inner surface of the second electrode, and when the piezoelectric polymer is pressed against either the first electrode or the second electrode opposite the first electrode, a fretting vibration is generated.

The haptic feedback fabric may further include a fixing fiber formed to intersect the first vibrating fiber and the second vibrating fiber so as to allow the first vibrating fiber and the second vibrating fiber to be fixedly pressed against each other.

The fixing fiber may be provided as a pair of fixing fibers, and the pair of fixing fibers may intersect an upper surface and a lower surface of the contacted first and second vibrating fibers.

Each of the spacer fiber and the fixing fiber may be made of a non-conductive material.

The piezoelectric polymer may include a polyvinylidene fluoride (PVDF)-based ferroelectric polymer or a relaxor ferroelectric polymer.

The PVDF-based ferroelectric polymer may include P(vinylidene fluoride (VDF)-trifluoroethylene (TrFE)), and the relaxor ferroelectric polymer may include P(VDF-trifluoroethylenechlorofluoroethylene (TrFECFE)) or P(VDF-TrFE-chlorotrifluoroethylene (CTFE).

A wearable device manufactured using the haptic feedback fabric may be provided.

Advantageous Effects

In accordance with the embodiments of the present invention, a haptic feedback function can be implemented by applying a fiber body and a textile, in which a piezoelectric polymer material is used, to a wearable device.

Further, in accordance with the embodiments of the present invention, a user can feel a tactile sensation while using a textile or a wearable device by providing a haptic feedback fiber body to which a combination of various types of fibers is applied.

MODES OF THE INVENTION

The present invention may be modified into various forms and may have a variety of embodiments, and, therefore, specific embodiments will be illustrated in the accompanying drawings and described in detail. The embodiments, however, are not to be understood in a sense which limits the present invention to the specific embodiments and should be construed to include modifications, equivalents, or substituents within the spirit and technical scope of the present invention. Also, in the following description of the present invention, when a detailed description of a known related art is determined to obscure the gist of the present invention, the detailed description thereof will be omitted.

Although the terms "first." "second," and the like may be used herein to describe various components, these components should not be limited to these terms. The terms are used only for the purpose of distinguishing one component from another component.

Terms used herein are used only for the purpose of describing the specific embodiments and are not intended to limit the present invention. Unless the context clearly dictates otherwise, the singular form includes the plural form. It should be understood that the terms "comprise," "include," and "have" specify the presence of stated herein features, numbers, steps, operations, components, elements, or combinations thereof, but do not preclude the presence or possibility of adding one or more other features, numbers, steps, operations, components, elements, or combinations thereof.

Hereinafter, embodiments of a haptic feedback fiber body, a haptic feedback fabric, and a wearable device according to the present invention will be described in detail with reference to the accompanying drawings. In the following description with reference to the accompanying drawings, the same or corresponding components are assigned with the same reference numerals, and a duplicate description thereof will be omitted.

Figure 1:
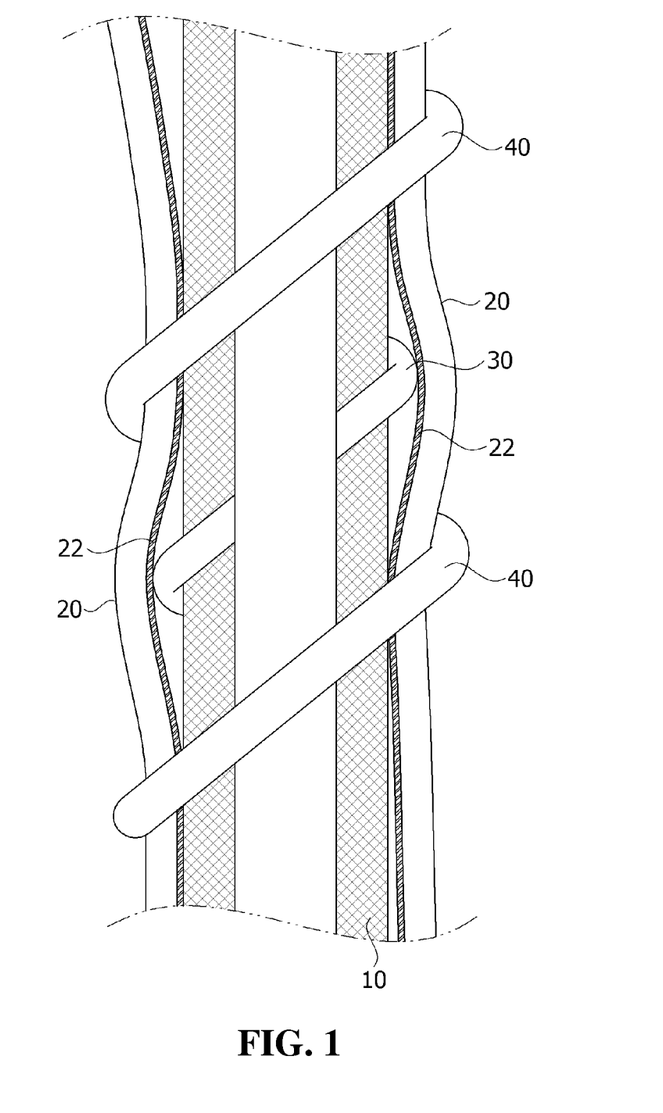
FIG. 1 is a diagram illustrating a portion of a haptic feedback fiber body according to one embodiment of the present invention.
Figure 2:
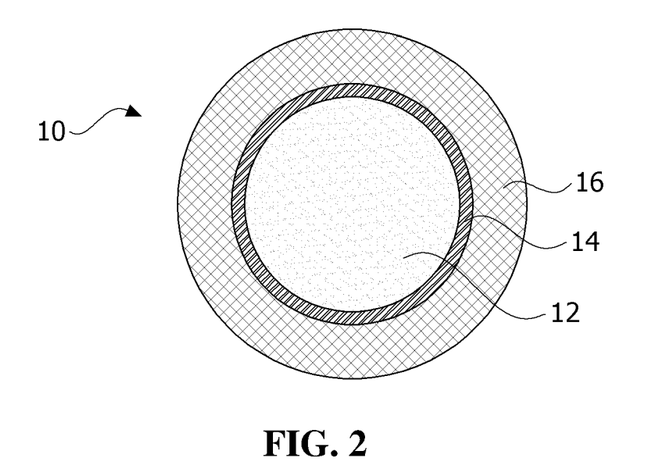
FIG. 2 is a cross-sectional view illustrating a core fiber shown in FIG. 1.

FIG. 1 is a diagram illustrating a portion of a haptic feedback fiber body according to one embodiment of the present invention, and FIG. 2 is a cross-sectional view illustrating a core fiber shown in FIG. 1.

As shown in the drawings, a haptic feedback fiber body according to one embodiment of the present invention includes a core fiber 10 having a first electrode 14 which surrounds an outer surface thereof, and a vibrating fiber 20 provided to be brought into intermittent contact with an outer surface of the core fiber 10 and having a second electrode 22 provided on an inner surface of the vibrating fiber 20, wherein a piezoelectric polymer 16 is provided on an outer surface of the first electrode 14 or on an inner surface of the second electrode 22, and, when the piezoelectric polymer 16 is pressed against the first electrode 14 or the second electrode 22 which is disposed to face the piezoelectric polymer 16, a fretting vibration may be generated.

Shown in FIG. 2 as well, the core fiber 10 includes a central part 12, the first electrode 14 which surrounds an outer surface of the central part 12, and the piezoelectric polymer 16 which surrounds the first electrode 14. In the present embodiment, although the piezoelectric polymer 16 has been described as being provided on the outer surface of the first electrode 14, the piezoelectric polymer 16 is not necessarily provided on the outer surface of the first electrode 14 and may be provided on the second electrode 22. This will be described in detail when another embodiment is described below. The core fiber 10 is formed of a single fiber and forms a single fiber body together with the vibrating fiber 20, a spacer fiber 30, and a fixing fiber 40 which will be described below.

In the present embodiment, the vibrating fiber 20 having the second electrode 22 on the inner surface thereof is provided on the outer surface of the core fiber 10 so as to be brought into intermittent contact with the outer surface of the core fiber 10. A fretting vibration is generated in a portion in which the vibrating fiber 20 is pressed against the core fiber 10. A user actually feels haptic feedback from that portion.

When the vibrating fiber 20 is brought into contact with an entire surface of the core fiber 10, since a vibration is generated on an entirety of the fiber body, the user cannot feel a local vibration in only a touching area. Thus, in the present embodiment, in order to allow the user to intuitively feel a haptic feedback function, the vibrating fiber 20 is formed to be brought into intermittent contact with the outer surface of the core fiber 10. Examples in which the vibrating fiber 20 is brought into intermittent contact with the outer surface of the core fiber 10 may be variously provided and are not limited to embodiments which will described below. That is, various embodiments may be provided as long as the vibrating fiber 20 is brought into intermittent contact with the outer surface of the core fiber 10 such that the user can feel haptic feedback in a desired area.

Referring to FIGS. 1 and 2, one or more vibrating fibers 20 are disposed in a length direction of the core fiber 10, and the spacer fiber 30 is wound between the core fiber 10 and the vibrating fiber 20 to form a gap therebetween so that the outer surface of the core fiber 10 is brought into intermittent contact with the vibrating fiber 20. The spacer fiber 30 serves to allow the vibrating fiber 20 to be brought into contact with the outer surface of the core fiber 10 at regular intervals in the length direction of the core fiber 10. In other words, the spacer fiber 30 is disposed between the core fiber 10 and the vibrating fiber 20 at regular intervals, thereby preventing the outer surface of the core fiber 10 from being brought into direct contact with the vibrating fiber 20 at regular intervals.

To this end, in FIG. 1, the spacer fiber 30 is provided to surround the outer surface of the core fiber 10 in a helical shape. Alternatively, one or more vibrating fibers 20 may be circumferentially disposed in the length direction of the core fiber 10 in which the spacer fiber 30 is wound. In this state, the vibrating fiber 20 is brought into contact with the outer surface of the core fiber 10 at regular intervals due to the helically wound spacer fiber 30 such that the above-described intermittent contact may be achieved.

Figure 3:
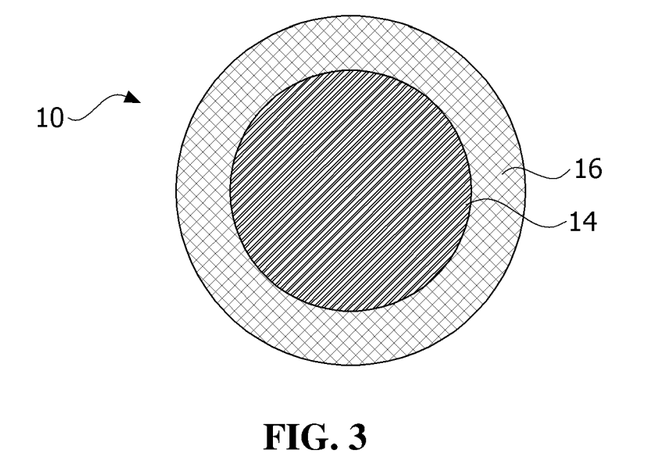
FIG. 3 is a cross-sectional view illustrating another example of the example shown in FIG. 2.

Meanwhile, in FIG. 2, the core fiber 10 has been illustrated as including the central part 12 and the first electrode 14 surrounding the outer surface of the central part 12. However, as shown in FIG. 3, the first electrode 14 may be formed to occupy an entirety of the central part of the core fiber 10.

Next, in order to fix the vibrating fiber 20, the fixing fiber 40 is wound on the outer surface of the core fiber 10. The fixing fiber 40 is also provided to surround the outer surface of the core fiber 10 in a helical shape. The fixing fiber 40 is provided to pass through the helical shape in which the spacer fiber 30 is disposed so as to not overlap the spacer fibers 30. That is, the fixing fiber 40 is wound to pass above and below the spacer fiber 30 which is wound around an intermediate portion in FIG. 1, and the spacer fiber 30 is wound to pass above and below the fixing fiber 40.

As described above, the fixing fiber 40 fixes the vibrating fiber 20 to the core fiber 10 and, simultaneously, allows the vibrating fiber 20 to be pressed against the outer surface of the core fiber 10 such that a fretting vibration may be easily generated.

When the fixing fiber 40 directs the vibrating fiber 20 to be pressed against the core fiber 10, the piezoelectric polymer 16 provided at an outermost portion of the core fiber 10 is in a state of being brought into contact with the second electrode 22. In this state, when electrical energy is applied to the first electrode 14 and the second electrode 22, the applied electrical energy is converted into mechanical vibration energy in the piezoelectric polymer 16 to implement a haptic feedback function.

Meanwhile, the above-described spacer fiber 30 and the above-described fixing fiber 40 are made of non-conductive materials. The spacer fiber 30 and the fixing fiber 40 are provided for intermittent contact and a fixation of the vibrating fiber 20. When the spacer fiber 30 and the fixing fiber 40 have conductivity, the haptic feedback function is not accurately implemented, and thus it is preferable for the spacer fiber 30 and the fixing fiber 40 to be made of non-conductive materials.

The piezoelectric polymer 16 may employ a polyvinylidene fluoride (PVDF)-based ferroelectric polymer (e.g., P(vinylidene fluoride (VDF)-trifluoroethylene (TrFE)) or a relaxor ferroelectric polymer (e.g., P(VDF-trifluoroethylenechlorofluoroethylene (TrFECFE)) or P(VDF-TrFE-chlorotrifluoroethylene (CTFE)).

For reference, P(VDF-TrFE) is composed of a combination of two monomolecular VDF and TrFE among PVDF-based polymers and is known as one among widely used piezoelectric polymers due to exhibiting a piezoelectric characteristic that is higher than piezoelectric characteristics of other piezoelectric polymers.

P(VDF-TrFE-CFE) or P(VDF-TrFE-CTFE), which is a relaxor ferroelectric polymer, is known as a very promising material that generates a strain at a maximum level from 5 to 7% under an electric field of about 150 V/μm.

Meanwhile, a haptic feedback fiber body according to another embodiment of the present invention will be described below with reference to FIGS. 4 and 5.

Figure 4:
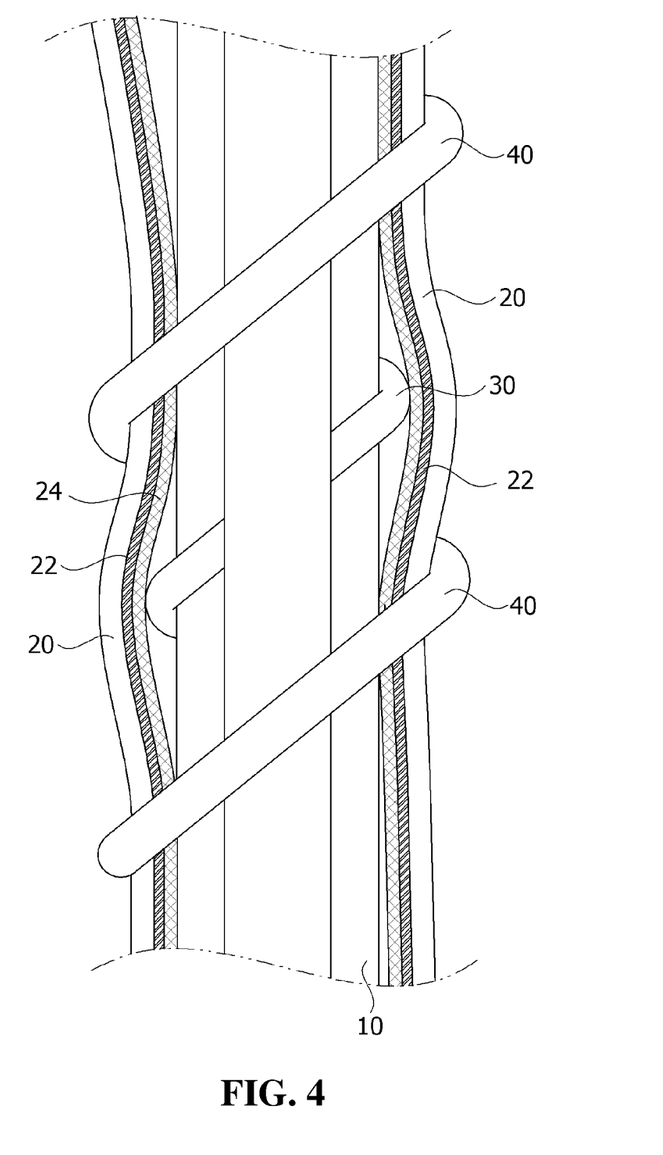
FIG. 4 is a diagram illustrating a portion of a haptic feedback fiber body according to another embodiment of the present invention.
Figure 5:
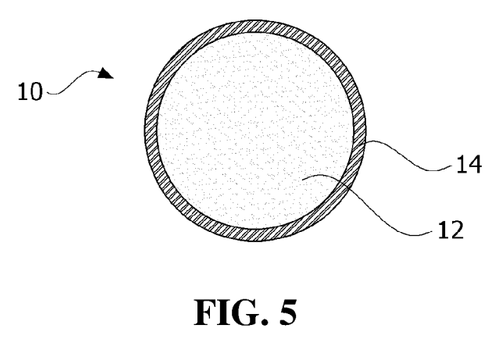
FIG. 5 is a cross-sectional view illustrating a core fiber shown in FIG. 4.

FIG. 4 is a diagram illustrating a portion of a haptic feedback fiber body according to another embodiment of the present invention, and FIG. 5 is a cross-sectional view illustrating a core fiber shown in FIG. 4.

As shown in the drawings, the present embodiment has a configuration which is substantially the same as that of the above-described embodiment. However, in the present embodiment, a piezoelectric polymer 24 is not provided on an outer surface of a first electrode 14 but is provided on an inner surface of a second electrode 22. That is, the piezoelectric polymer 24 is not provided on a core fiber 10 but is provided on a vibrating fiber 20 side.

The piezoelectric polymer 24 is disposed between two opposing electrodes. When the two opposing electrodes are in contact with each other and thus electrical energy is applied, the piezoelectric polymer 24 generates a fretting vibration to implement a haptic feedback function. Therefore, the piezoelectric polymer 24 may generate mechanical vibration in a state in which the first electrode 14 is pressed against the second electrode 22 as long as the piezoelectric polymer 24 is provided on either the first electrode 14 or the second electrode 22 opposite the first electrode 14.

Meanwhile, a haptic feedback fiber body according to still another embodiment of the present invention will be described below with reference to FIGS. 6 and 7.

Figure 6:
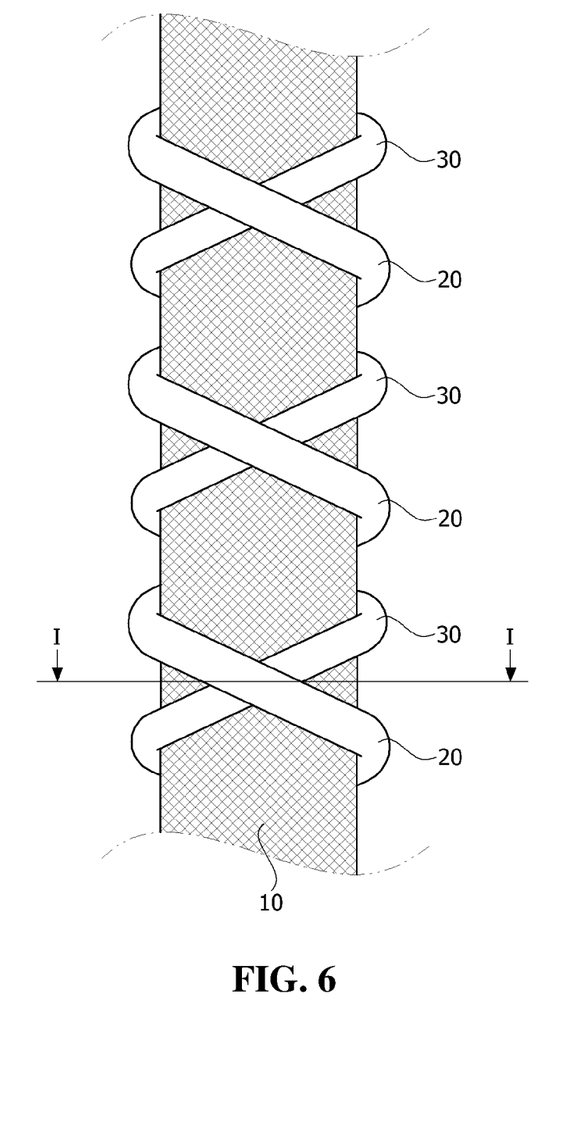
FIG. 6 is a diagram illustrating a portion of a haptic feedback fiber body according to still another embodiment of the present invention.
Figure 7:
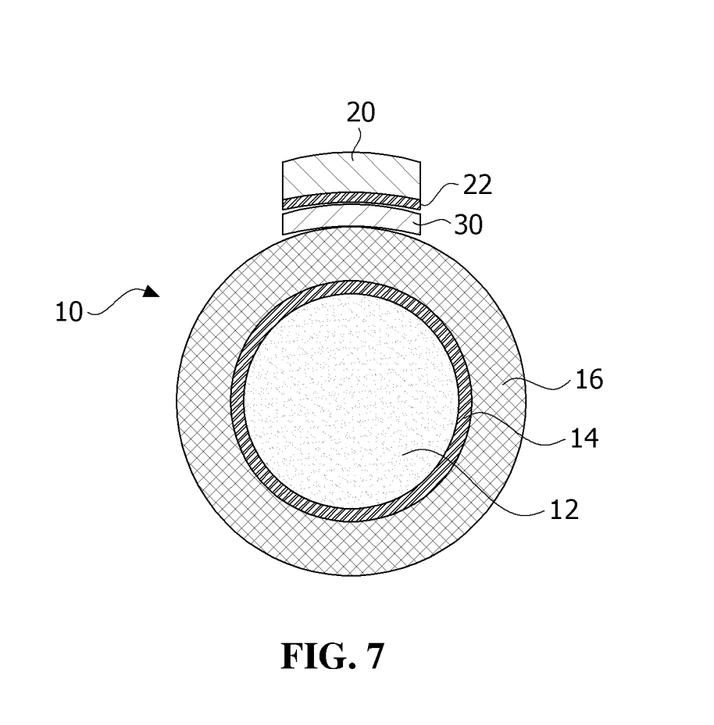
FIG. 7 is a cross-sectional view taken along line I-I in FIG. 6.

FIG. 6 is a diagram illustrating a portion of a haptic feedback fiber body according to still another embodiment of the present invention, and FIG. 7 is a cross-sectional view taken along line I-I in FIG. 6.

As shown in the drawings, in the present embodiment, a vibrating fiber 20 and a spacer fiber 30 are provided to surround an outer surface of the core fiber 10 in a helical shape. That is, in the above-described embodiments, one or more vibrating fibers 20 are provided to be disposed on the outer surface of the core fiber 10 in the length direction thereof. However, in the present embodiment, the vibrating fiber 20 together with the spacer fiber 30 is wound on the outer surface of the core fiber 10 in a helical shape.

As described above, when the vibrating fiber 20 and the spacer fiber 30 are wound, the vibrating fiber 20 and the spacer fiber 30 are not wound in the same direction but are wound to intersect in a diagonal direction. That is, as shown in FIG. 5, when viewed from the front, the vibrating fiber 20 and the spacer fiber 30 are wound to intersect in an X shape. In this case, the spacer fiber 30 is provided to be disposed between the outer surface of the core fiber 10 and the vibrating fiber 20 at an intersection in which the vibrating fiber 20 and the spacer fiber 30 intersect. Consequently, a gap is generated between the core fiber 10 and the vibrating fiber 20 due to the spacer fiber 30.

In the present drawing, although the vibrating fiber 20 has been illustrated as being brought into contact with only one portion of the outer surface of the core fiber 10, the present invention is not limited thereto, and the vibrating fiber 20 may be formed to be pressed against some portions of the outer surface of the core fiber 10.

The above-described embodiments are merely presented as an example of a configuration in which the vibrating fiber 20 is brought into intermittent contact with the outer surface of the core fiber 10, and any embodiment may be employed as long as a configuration allows the vibrating fiber 20 to be brought into intermittent contact with the outer surface of the core fiber 10.

Meanwhile, a haptic feedback fabric may be woven using the above-described haptic feedback fiber body. Further, the woven haptic feedback fabric may also be used to manufacture a wearable device.

Meanwhile, a haptic feedback fabric according to one embodiment of the present invention will be described below with reference to FIGS. 8 and 9.

Figure 8:
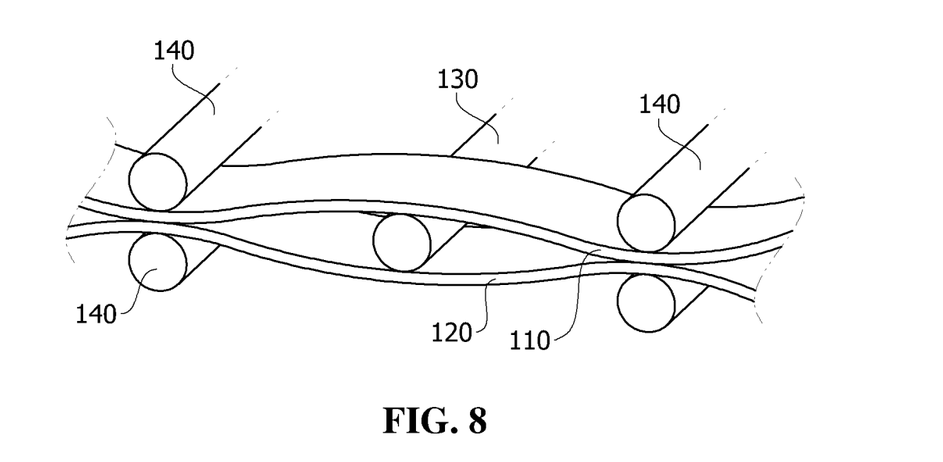
FIG. 8 is a diagram illustrating a portion of a haptic feedback fabric according to one embodiment of the present invention.
Figure 9:
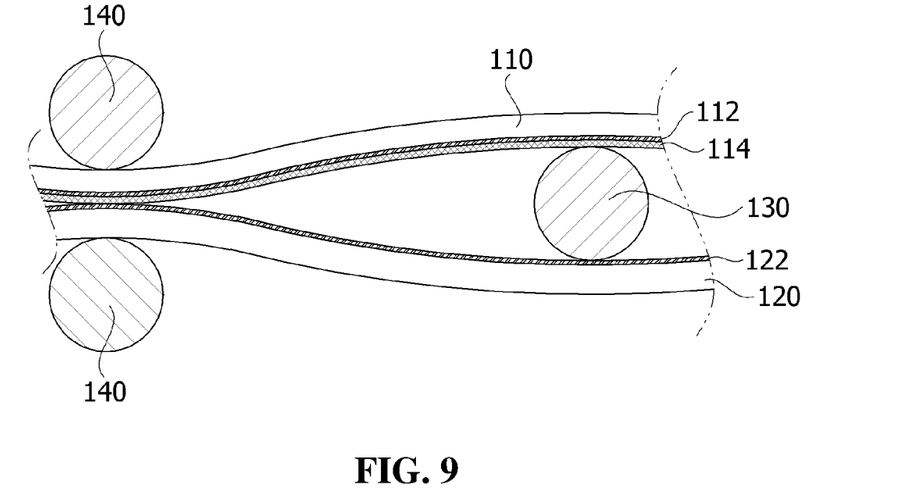
FIG. 9 is a cross-sectional view illustrating the haptic feedback fabric shown in FIG. 8.

FIG. 8 is a diagram illustrating a portion of a haptic feedback fabric according to one embodiment of the present invention, and FIG. 9 is a cross-sectional view illustrating the haptic feedback fabric shown in FIG. 8.

As shown in the drawings, the haptic feedback fabric according to the present invention may include a first vibrating fiber 110 having one surface on which a first electrode 112 is provided, a second vibrating fiber 120 having one surface on which a second electrode 122 opposite the first electrode 112 is provided, and a spacer fiber 130 which intersects between the first vibrating fiber 110 and the second vibrating fiber 120 to form a gap between the first vibrating fiber 110 and the second vibrating fiber 120.

In the present embodiment, the haptic feedback fabric may be manufactured by weaving. For example, the first vibrating fiber 110 and the second vibrating fiber 120 constitute warp threads, the spacer fiber 130 and a fixing fiber 140 constitute weft threads, and fibers serving as warp threads and weft threads intersect to manufacture a fabric.

The first vibrating fiber 110 and the second vibrating fiber 120 are provided to be brought into intermittent contact with each other in a length direction. That is, the first vibrating fiber 110 and the second vibrating fiber 120 may not be brought into contact with each other at a position at which the spacer fiber 130 intersects the first vibrating fiber 110 and the second vibrating fiber 120 and may be pressed against each other at a position at which the fixing fiber 140 intersects the first vibrating fiber 110 and the second vibrating fiber 120. As described in detail below, a fretting vibration is generated in a portion in which the first vibrating fiber 110 is pressed against the second vibrating fiber 120. A user actually feels haptic feedback from that portion.

When the first vibrating fiber 110 is brought into contact with an entire surface of the second vibrating fiber 120, since a vibration is generated on an entirety of the fabric, the user cannot feel a local vibration in only an area in which he or she has touched. Thus, in the present embodiment, in order to allow the user to intuitively feel a haptic feedback function, the first vibrating fiber 110 and the second vibrating fiber 120 are formed to be brought into intermittent contact with each other in the length direction. Examples in which the first vibrating fiber 110 and the second vibrating fiber 120 are brought into intermittent contact with each other may be variously provided and are not limited to embodiments which will described below. That is, various embodiments may be provided as long as the first vibrating fiber 110 is brought into intermittent contact with the second vibrating fiber 120 such that the user can feel haptic feedback in a desired area.

Referring to FIG. 9, the first electrode 112 is provided on an inner surface of the first vibrating fiber 110, and a piezoelectric polymer 114 is provided on an inner surface of the first electrode 112. Further, the second electrode 122 is provided on an inner surface of the second vibrating fiber 120. When electrical energy is applied to the first electrode 112 and the second electrode 122 in a state in which the first vibrating fiber 110 and the second vibrating fiber 120 are pressed against each other due to the fixing fiber 140, the applied electrical energy is converted into mechanical vibration energy in the piezoelectric polymer 114 to implement the haptic feedback function.

Meanwhile, for intermittent contact between the first vibrating fiber 110 and the second vibrating fiber 120, the spacer fiber 130 intersects between the first vibrating fiber 110 and the second vibrating fiber 120 at a predetermined interval. The spacer fiber 130 may be disposed at a regular interval in the length direction of the first vibrating fiber 110 and the second vibrating fiber 120 and, alternatively, may be disposed at various intervals according to a pattern of the fabric.

As shown in FIG. 9, a pair of fixing fibers 140 may be provided to intersect an upper surface of the first vibrating fiber 110 and a lower surface of the second vibrating fiber 120, wherein the first vibrating fiber 110 is brought into contact with the second vibrating fiber 120. Like the spacer fiber 130, the fixing fiber 140 may also be disposed at a predetermined interval in the length direction of the first vibrating fiber 110 and the second vibrating fiber 120. The fixing fiber 140 is provided at a portion in which the spacer fiber 130 does not intersect to serve to direct the first vibrating fiber 110 and the second vibrating fiber 120 to be pressed against each other.

Meanwhile, the above-described spacer fiber 130 and the above-described fixing fiber 140 are made of non-conductive materials. The spacer fiber 130 and the fixing fiber 140 are provided for an intermittent contact and a fixation between the first vibrating fiber 110 and the second vibrating fiber 120. When the spacer fiber 30 and the fixing fiber 40 have conductivity, the haptic feedback function is not accurately implemented, and thus it is preferable for the spacer fiber 30 and the fixing fiber 40 to be made of non-conductive materials.

The piezoelectric polymer 114 may employ a polyvinylidene fluoride (PVDF)-based ferroelectric polymer (e.g., P(vinylidene fluoride (VDF)-trifluoroethylene (TrFE)) or a relaxor ferroelectric polymer (e.g., P(VDF-trifluoroethylenechlorofluoroethylene (TrFECFE)) or P(VDF-TrFE-chlorotrifluoroethylene (CTFE)).

For reference, P(VDF-TrFE) is composed of a combination of two monomolecular VDF and TrFE among PVDF-based polymers and is known as one among widely used piezoelectric polymers due to exhibiting a piezoelectric characteristic that is higher than piezoelectric characteristics of other piezoelectric polymers.

P(VDF-TrFE-CFE) or P(VDF-TrFE-CTFE), which is a relaxor ferroelectric polymer, is known as a very promising material that generates a strain at a maximum level from 5 to 7% under an electric field of about 150 V/μm.

Meanwhile, a haptic feedback fabric according to another embodiment of the present invention will be described below with reference to FIG. 10.

Figure 10:
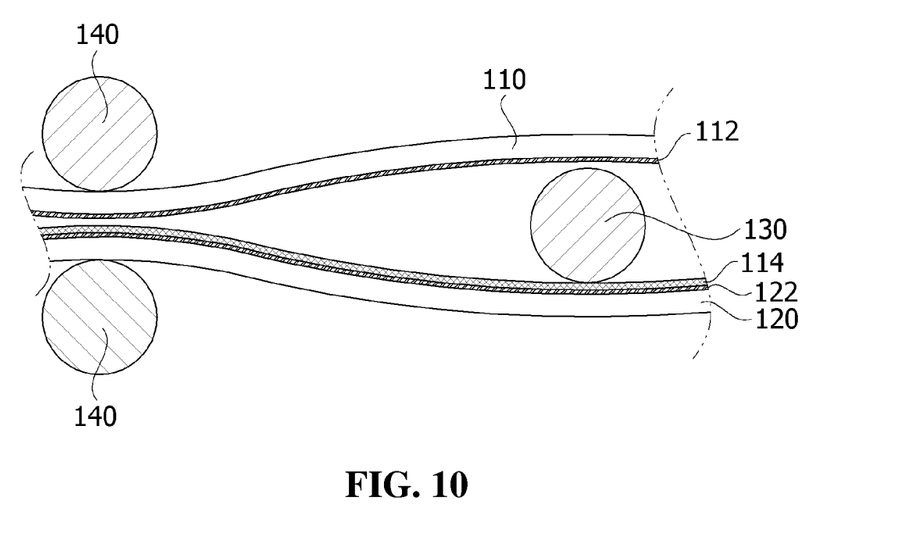
FIG. 10 is a cross-sectional view illustrating another embodiment of the haptic feedback fabric shown in FIG. 8.

FIG. 10 is a cross-sectional view illustrating another embodiment of the haptic feedback fabric shown in FIG. 8.

As shown in the drawings, the present embodiment has a configuration which is substantially the same as that of the above-described embodiment. However, in the present embodiment, a piezoelectric polymer 114 is not provided on an inner surface of a first electrode 112 but is provided on an inner surface of a second electrode 122. That is, the piezoelectric polymer 114 is not provided on a first vibrating fiber 110 but is provided on a second vibrating fiber 120 side.

The piezoelectric polymer 114 is disposed between two opposing electrodes. When the two opposing electrodes are in contact with each other and thus electrical energy is applied, the piezoelectric polymer 114 generates a fretting vibration to implement a haptic feedback function. Therefore, the piezoelectric polymer 114 may generate mechanical vibration in a state in which a first electrode 112 is pressed against the second electrode 122 as long as the piezoelectric polymer 114 is provided on either the first electrode 112 or the second electrode 122 opposite the first electrode 112.

Meanwhile, a haptic feedback fabric according to still another embodiment of the present invention will be described below with reference to FIGS. 11 and 12.

Figure 11:
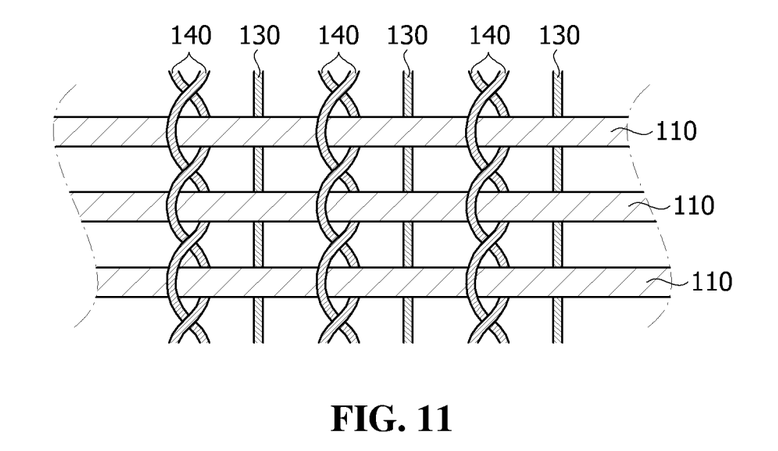
FIGS. 11 and 12 are diagrams illustrating a haptic feedback fabric according to still another embodiment of the present invention.
Figure 12:
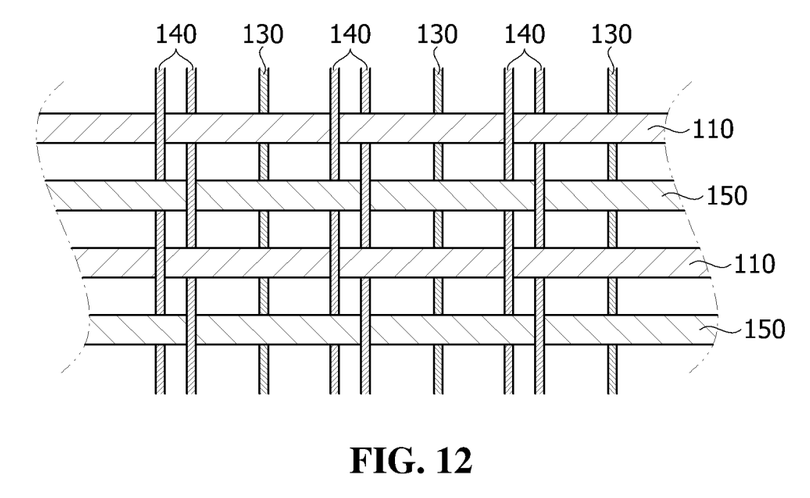

FIGS. 11 and 12 are diagrams illustrating a haptic feedback fabric according to still another embodiment of the present invention.

Unlike the above-described embodiments, referring to FIG. 11, in the present embodiment, a twisted shape of a fixing fiber 140 may be changed. That is, as in the above-described embodiments, the fixing fiber 140 may be provided to intersect an upper surface of a first vibrating fiber 110 and a lower surface of a second vibrating fiber 120, wherein the first vibrating fiber 110 is brought into contact with the second vibrating fiber 120. However, the fixing fiber 140 is formed to be twisted by intersecting in a diagonal direction between the first vibrating fiber 110 and the second vibrating fiber 120 which are consecutively disposed in a row or column direction.

Consequently, since a portion between the first vibrating fiber 110 and the second vibrating fiber 120 may be woven more firmly, rigidity of the haptic feedback fabric may be improved.

Alternatively, as shown in FIG. 12, an auxiliary fiber 150 may be provided between the first vibrating fiber 110 and the second vibrating fiber 120 which are consecutively disposed in the row or column direction. The auxiliary fiber 150 may intersect with the spacer fiber 130 and the fixing fiber 140 to be twisted therewith such that the rigidity of the haptic feedback fabric may be improved. The above-described weave pattern of the fiber is merely an example, and any pattern may be employed as long as a structure can improve the rigidity of the fabric while implementing a haptic feedback function.

The above-described embodiments are merely presented as an example of a configuration in which the first vibrating fiber 110 is brought into intermittent contact with the second vibrating fiber 120, and any embodiment may be employed as long as a weave pattern can allow the first vibrating fiber 110 to be brought into intermittent contact with the second vibrating fiber 120.

Meanwhile, the woven haptic feedback fabric may also be used to manufacture a wearable device.

Although the description has been made with reference to the specific embodiments of the present invention, it should be understood that various alternations and modifications of the present invention can be devised by those skilled in the art to which the present invention pertains without departing from the spirit and scope of the present invention, which are defined by the appended claims.

The invention claimed is:

1. A haptic feedback fiber body comprising:
   a core fiber having a first electrode which surrounds an outer surface thereof; and
   a vibrating fiber provided to be brought into intermittent contact with the outer surface of the core fiber and having an inner surface on which a second electrode is provided,
   wherein a piezoelectric polymer is provided on an outer surface of the first electrode or an inner surface of the second electrode, and
   when the piezoelectric polymer is pressed against either the first electrode or the second electrode opposite the first electrode, a fretting vibration is generated.

2. The haptic feedback fiber body of claim 1, further comprising a spacer fiber wound on the outer surface of the core fiber to form a gap between the core fiber and the vibrating fiber.

3. The haptic feedback fiber body of claim 2, wherein the spacer fiber is provided to surround the outer surface of the core fiber in a helical shape.

4. The haptic feedback fiber body of claim 3, wherein one or more vibrating fibers are provided on the outer surface of the core fiber, on which the spacer fiber is wound, in a length direction of the core fiber.

5. The haptic feedback fiber body of claim 4, further comprising a fixing fiber wound around the core fiber to fix the vibrating fibers fixed to the outer surface of the core fiber.

6. The haptic feedback fiber body of claim 5, wherein the fixing fiber is provided to surround the outer surface of the core fiber in a helical shape to pass through the helical shape in which the spacer fiber is wound.

7. The haptic feedback fiber body of claim 5, wherein each of the spacer fiber and the fixing fiber is made of a non-conductive material.

8. The haptic feedback fiber body of claim 5, wherein:
   the vibrating fiber and the spacer fiber are provided to surround the outer surface of the core fiber in a spiral shape; and
   the vibrating fiber intersects the spacer fiber in a diagonal direction, and the spacer fiber is provided to be disposed between the vibrating fiber and the outer surface of the core fiber.

9. The haptic feedback fiber body of claim 1, wherein the piezoelectric polymer includes a polyvinylidene fluoride (PVDF)-based ferroelectric polymer or a relaxor ferroelectric polymer.

10. The haptic feedback fiber body of claim 9, wherein the PVDF-based ferroelectric polymer includes P(vinylidene fluoride (VDF)-trifluoroethylene (TrFE)), and the relaxor ferroelectric polymer includes P(VDF-trifluoroethylenechlorofluoroethylene (TrFECFE)) or P(VDF-TrFE-chlorotrifluoroethylene (CTFE)).

11. A haptic feedback fabric comprising:
   a first vibrating fiber having one surface on which a first electrode is provided;
   a second vibrating fiber having one surface on which a second electrode opposite the first electrode is provided; and
   a spacer fiber formed to intersect between the first vibrating fiber and the second vibrating fiber so as to form a gap between the first vibrating fiber and the second vibrating fiber,
   wherein a piezoelectric polymer is provided on an outer surface of the first electrode or an inner surface of the second electrode, and when the piezoelectric polymer is pressed against either the first electrode or the second electrode opposite the first electrode, a fretting vibration is generated.

12. The haptic feedback fabric of claim 11, further comprising a fixing fiber formed to intersect the first vibrating fiber and the second vibrating fiber so as to allow the first vibrating fiber and the second vibrating fiber to be fixedly pressed against each other.

13. The haptic feedback fabric of claim 12, wherein:
the fixing fiber is provided as a pair of fixing fibers; and
the pair of fixing fibers intersect an upper surface and a lower surface of the contacted first and second vibrating fibers.

14. The haptic feedback fabric of claim 13, wherein the fixing fiber intersects to be twisted in a diagonal direction between the first vibrating fiber and the second vibrating fiber which are consecutively disposed in a row or column direction.

15. The haptic feedback fabric of claim 12, wherein an auxiliary fiber is provided between the first vibrating fiber and the second vibrating fiber which are consecutively disposed in a row or column direction and intersects the spacer fiber and the fixing fiber to be twisted therewith.

16. The haptic feedback fabric of claim 11, wherein each of the spacer fiber and a fixing fiber is made of a non-conductive material.

17. The haptic feedback fabric of claim 11, wherein the piezoelectric polymer includes a polyvinylidene fluoride (PVDF)-based ferroelectric polymer or a relaxor ferroelectric polymer.

18. The haptic feedback fabric of claim 17, wherein the PVDF-based ferroelectric polymer includes P(vinylidene fluoride (VDF)-trifluoroethylene (TrFE)), and the relaxor ferroelectric polymer includes P(VDF-trifluoroethylenechlorofluoroethylene (TrFECFE)) or P(VDF-TrFE-chlorotrifluoroethylene (CTFE)).

19. A wearable device manufactured using the haptic feedback fabric according to claim 11.

* * * * *